(12) United States Patent
Tyan et al.

(10) Patent No.: US 7,951,421 B2
(45) Date of Patent: May 31, 2011

(54) VAPOR DEPOSITION OF A LAYER

(75) Inventors: Yuan-Sheng Tyan, Webster, NY (US);
Michael Long, Hilton, NY (US); Giana M. Phelan, Rochester, NY (US);
Thomas R. Cushman, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 916 days.

(21) Appl. No.: 11/407,840

(22) Filed: Apr. 20, 2006

(65) Prior Publication Data

US 2007/0248753 A1    Oct. 25, 2007

(51) Int. Cl.
*C23C 16/00* (2006.01)

(52) U.S. Cl. ........... 427/248.1; 427/255.23; 427/255.25; 427/255.6; 427/255.7

(58) Field of Classification Search ............... 427/248.1, 427/255.23, 255.25, 255.6, 255.7
See application file for complete search history.

(56) References Cited

U.S. PATENT DOCUMENTS

| | | | |
|---|---|---|---|
| 2,447,789 A | 8/1948 | Barr | |
| 4,769,292 A | 9/1988 | Tang et al. | |
| 5,703,436 A | 12/1997 | Forrest et al. | |
| 6,107,734 A | 8/2000 | Tanaka et al. | |
| 6,194,031 B1 * | 2/2001 | Barnard et al. | 427/255.5 |
| 6,274,980 B1 | 8/2001 | Burrows et al. | |
| 6,337,492 B1 | 1/2002 | Jones et al. | |
| 6,717,358 B1 | 4/2004 | Liao et al. | |
| 2003/0170491 A1 | 9/2003 | Liao et al. | |
| 2003/0189401 A1 | 10/2003 | Kido et al. | |
| 2005/0079278 A1* | 4/2005 | Burrows et al. | 427/69 |
| 2006/0062915 A1 | 3/2006 | Long et al. | |

FOREIGN PATENT DOCUMENTS

| | | |
|---|---|---|
| EP | 0982411 | 3/2000 |
| EP | 1413644 | 4/2004 |
| GB | 2073442 | 10/1981 |
| JP | 09219289 | 8/1997 |
| JP | 2003-045676 | 2/2003 |
| WO | 2007-053532 | 5/2007 |

OTHER PUBLICATIONS

Swain et al, Characterization of PbxMn1-xS thin films prepared by flash evpoaration technique, Thin Solid Films, Elsevier-Sequoia SA, V287, No. 1, Oct. 1996, pp. 110-114.
Tang et al, Electroluminescence of doped organic thin films, J. Appl. Phys. 65 (9) May 1, 1989 (pp. 3610-3616.
Adachi et al, Electroluminescence in Organic Films with Three-Layer Structure, Japanese Journal of Applied Physics, vol. 27, No. 2, Feb. 1988 pp. L269-L271.

(Continued)

*Primary Examiner* — Timothy H Meeks
*Assistant Examiner* — Kelly M Gambetta
(74) *Attorney, Agent, or Firm* — Morgan, Lewis & Bockius LLP

(57) ABSTRACT

A method of depositing a layer onto a substrate, comprising heating an evaporator to a temperature capable of completely evaporating the evaporant to be deposited, dispensing into the evaporator one or more quantized units of the evaporant where the evaporant is completely vaporized, providing an area vapor dispenser having a plurality of apertures, and directing the vaporized evaporant from the evaporator to the area vapor dispenser so that the evaporant is dispensed through the apertures to deposit the layer on the substrate.

17 Claims, 1 Drawing Sheet

OTHER PUBLICATIONS

Figure 1:
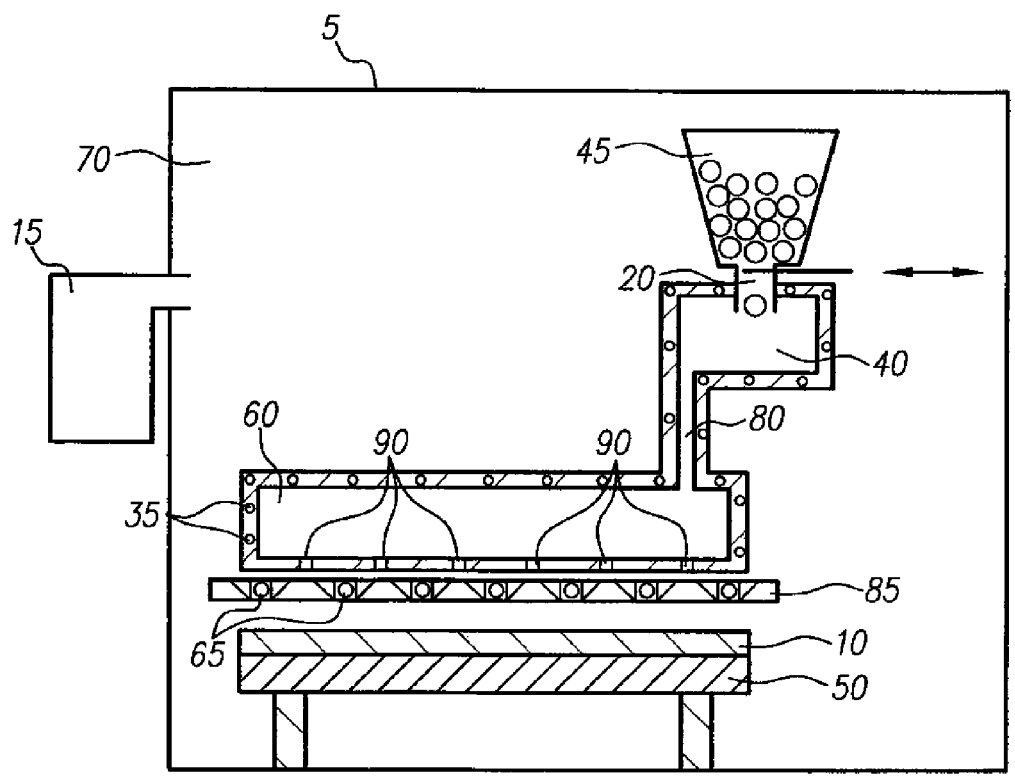

Tang et al, Organic electroluminescent diodes, Appl. Phys. Lett. 51 (12) Sep. 21, 1987, pp. 913-915.

Chang et al, High-Efficiency Organic Electroluminescent Device with Multiple Emitting Units, Jap. Journal of Appl. Phys. vol. 43, No. 9a, 2004, pp. 6418-6422.

Liao et al, High-efficiency tandem organic light-emitting diodes, Appl. Phys. Lett., vol. 84, No. 2, Jan. 12, 2004, pes 167-169.

Matsuomoto et al, 27:5L: Late-News Paper: Multiphoton Organic EL device having Charge Generation Layer, SID 03 Digest, pp. 979-981, May 2003.

* cited by examiner

VAPOR DEPOSITION OF A LAYER

CROSS REFERENCE TO RELATED APPLICATIONS

Reference is made to commonly assigned U.S. patent application Ser. No. 10/784,585 filed Feb. 23, 2004, by Michael Long et al, entitled "Device and Method for Vaporizing Temperature Sensitive Materials", U.S. patent application Ser. No. 10/805,847 filed Mar. 22, 2004, by Michael Long et al, entitled "High Thickness Uniformity Vaporization Source", U.S. patent application Ser. No. 10/352,558 filed Jan. 28, 2003, by Jeremy Grace et al, entitled "Method of Designing a Thermal Physical Vapor Deposition System", U.S. patent application Ser. No. 10/805,980 filed Mar. 22, 2004, by Michael Long et al, entitled "Vaporizing Fluidized Organic Materials", and U.S. patent application Ser. No. 11/263,106 filed Oct. 31, 2005, entitled "Vapor Deposition Apparatus and Method" by Michael Long et al, the disclosures of which are herein incorporated by reference.

FIELD OF THE INVENTION

The present invention relates to the field of physical vapor deposition where a source material is heated to a temperature so as to cause vaporization and create a vapor plume to form a thin film on a surface of a substrate.

BACKGROUND OF THE INVENTION

Organic thin-film electronic devices including organic electroluminescent (EL) devices or organic light-emitting devices (OLEDs), organic thin-film photovoltaic devices, and organic thin-film transistors comprise one or more thin-film organic layers most frequently prepared by vacuum deposition. OLEDs, for example, are electronic devices that emit light in response to an applied potential. The structure of a basic OLED includes, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic Electroluminescent Diodes", *Applied Physics Letters,* 51, 913 (1987), and commonly assigned U.S. Pat. No. 4,769,292, demonstrated highly efficient OLEDs using such a layer structure. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics,* 27, L269 (1988), and by Tang et al., "Electroluminescence of Doped Organic Thin Films", *Journal of Applied Physics,* 65, 3610 (1989). The LEL commonly includes a host material doped with a guest material. The HTL and ETL layers can be multi-components. Wherein the layer structures are denoted as HTL/LEL/ETL, Further, there are other multilayer OLEDs that contain a hole-injecting layer (HIL), or an electron-injecting layer (EIL), or a hole-blocking layer, or an electron-blocking layer in the devices. These structures have further resulted in improved device performance.

Moreover, in order to further improve the performance of the OLEDs, an OLED structure called tandem OLED (or stacked OLED), is formed by stacking several individual OLEDs vertically. Forrest et al. in U.S. Pat. No. 5,703,436 and Burrows et al. in U.S. Pat. No. 6,274,980 disclosed their tandem OLEDs. In their inventions, the tandem OLEDs are fabricated by vertically stacking several OLEDs, each independently emitting light of a different color or of the same color. Forrest et al. believed that by using their tandem OLED structure, full color emission devices with higher integrated density in the display can be made. However, each OLED unit in their devices needs a separate power source. In an alternative design, a tandem OLED (or stacked OLED, or cascaded OLED) structure, which is fabricated by stacking several individual OLEDs vertically and driven by only a single power source, was disclosed in (see U.S. Pat. Nos. 6,337,492, 6,107,734, 6,717,358, U.S. Patent Publication Nos. 2003/0170491 A1, 2003/0189401A1, and JP Patent Publication No. 2003045676A). In a tandem OLED having a number of N(N>1) EL units, the luminous efficiency can be N times as high as that of a conventional OLED containing only one EL unit (of course, the drive voltage can also be N times as high as that of the conventional OLED). Therefore, in one aspect to achieve long lifetime, the tandem OLED needs only about 1/N of the current density used in the conventional OLED to obtain the same luminance although the lifetime of the tandem OLED will be about N times that of the conventional OLED. In the other aspect to achieve high luminance, the tandem OLED needs only the same current density used in the conventional OLED to obtain a luminance N times as high as that of the conventional OLED while maintaining about the same lifetime. Each organic EL unit in a tandem OLED is capable of supporting hole and electron-transport, and electron-hole recombination to produce light. Each organic EL unit can comprise a plurality of layers including HTL (hole transport layer), ETL (electron transport layer), LEL (light emitting layer), HIL (hole injection layer), and EIL (electron injection layer). A light-emitting layer (LEL) can comprise one or more sub-layers each emitting a different color. Thus a state-of-the-art OLED device can have a large number of layers. Each of these layers can range from a few nanometer to about a micrometer in thickness and can contain one or more materials. For predictable and reproducible performance, the thickness and the composition of these layers need control.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. The low deposition rate and frequent source recharging place substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials. These multiple sources must be maintained in an angled arrangement so that the evaporated materials from each source converge at a common point on an OLED substrate. This use of multiple spaced-apart sources leads to obvious limitations in the number of materials that can be co-deposited and obvious deficiencies in the homogeneity of the host and dopant films.

The organic materials used in OLED devices have a highly non-linear vaporization-rate dependence on source temperature. A small change in source temperature leads to a very large change in vaporization rate. Despite this, prior art devices employ source temperature as the only means to control vaporization rate. To achieve good temperature control, prior art deposition sources typically utilize heating structures whose solid volume is much larger than the organic charge volume, composed of high thermal-conductivity materials that are well insulated. The high thermal conductivity insures good temperature uniformity through the structure and the large thermal mass helps to maintain the temperature within a critically small range by reducing temperature fluctuations. These measures have the desired effect on steady-state vaporization rate stability but have a detrimental effect at start-up. It is common that these devices must operate for many hours at start-up before steady state thermal equilibrium and hence a steady vaporization rate is achieved.

A further limitation of the prior art is that the geometry of the vapor manifold changes as the organic material charge is consumed. This change requires that the heater temperature change to maintain a constant vaporization rate and it is observed that the plume shape of the vapor exiting the orifices changes as a function of the organic material thickness and distribution in the source.

Furthermore, the prior art cannot be used conveniently to prepare devices that have a large number of layers (more than four or five), in particular if some of these layers are only a few nanometers in thickness. These multilayer structures are needed to achieve the high performance of OLED devices.

Another limitation of the prior art vapor deposition method is the difficulty in controlling the deposition rate and film thickness during the layer deposition process. The most common method uses crystal thickness and rate monitors. The crystals have limited lifetime and cannot easily support extended runs; this method also has limited accuracy especially for materials that have less than perfect sticking coefficients and for layers that are extremely thin.

SUMMARY OF THE INVENTION

It is therefore an object of the present invention to vaporize organic materials while limiting material exposure to temperatures that can cause material degradation.

This object is achieved by a method for vaporizing organic materials onto a surface, to form a film comprising:

a) heating an evaporator to a temperature capable of completely evaporating the evaporant to be deposited;

b) dispensing into the evaporator one or more quantized units of the evaporant where the evaporant is completely vaporized;

c) providing an area vapor dispenser having a plurality of apertures, and d) directing the vaporized evaporant from the evaporator to the area vapor dispenser so that the evaporant is dispensed through the apertures to deposit the layer on the substrate area.

It is an advantage of the present invention that the method overcomes the heating and degradation limitations of prior art methods in that only a small amount of the materials needed to complete the deposition of a single layer is heated to the vaporization temperature at a rapid rate, so that the organic material changes very rapidly from the solid to the vapor state and is said to undergo flash vaporization. The method thus allows extended operation of the process with substantially reduced risk of degrading even very temperature-sensitive organic materials. Flash vaporization additionally permits materials having different vaporization rates and degradation temperature thresholds to be co-vaporized without the need for multiple, angled sources as in the prior art.

It is a further advantage of the present invention that it requires no additional deposition rate or thickness control. The amount of material dispensed into the evaporator determines the thickness of the materials deposited which can be as precise as the precision in controlling the amount of the dispensed materials.

It is a further advantage of the present invention that the coating process can be started and stopped by starting and stopping the dispensing of material into the evaporator. This feature reduces contamination of the deposition chamber walls and conserves the organic materials when a substrate is not being coated.

It is a further advantage that the present device achieves substantially higher vaporization rates than in prior art devices without material degradation. Further still, precise control of the evaporator temperature is not required.

It is a further advantage of the present invention that it can provide a vapor source in any orientation.

Another feature of this invention is that it allows a single source to deposit two or more organic material components.

It is still further feature of this invention that it facilitates the deposition of multilayered-devices.

It is a further advantage of the present invention that the area vapor distributor can control the uniformity or the thickness profile of the coated thin-film.

It is a further advantage of the present invention that the use of a carrier gas for delivering vaporized material to form the layer on the substrate is not necessary.

BRIEF DESCRIPTION OF THE DRAWINGS

FIG. 1 is a cross-sectional view of one embodiment of a device according to the present invention; and FIG. 2 shows a tandem OLED structure that can be prepared by the method in accordance with the present invention

DETAILED DESCRIPTION OF THE INVENTION

Turning now to FIG. 1, there is shown a cross sectional view of one embodiment of a device of this disclosure. Vaporization apparatus 5 in a deposition chamber 70 is a device for vaporizing materials onto a substrate surface to form a film and includes a heated evaporator 40, a heated area vapor dispenser 60, a platform 50, a container 45, a material dispenser 20, and a heated conduit 80 for connecting evaporator 40 to vapor dispenser 60. Area vapor dispenser 60 includes heating elements 35 and also includes one or more apertures 90. Vaporization apparatus 5 also includes one or more shields 85 that may include cooling elements 65. Also shown is a substrate 10 placed on platform 50 and a vacuum generator 15 that can be used to reduce the pressure in deposition chamber 70.

In one embodiment, container 45 contains a quantity of the material to be deposited, herein referred to as the evaporant, in quantized units. Examples of the quantized units includes solid pieces, or packets containing solid particles, or solid particles pressed into a pellet, or solid particles suspended in an inert liquid, or solid particles dispersed in a super critical $CO_2$, or a solvent. When the evaporant is in solution, an inkjet-type printhead can be used to dispense the quantized unit of the evaporant. Each quantized unit contains a prescribed amount of the evaporant designed upon complete evaporation to deposit the entirety or a fixed fraction of the entirety of the layer to be deposited. Alternatively, the quantized units of evaporant can be dispensed along with some inert materials. The inert material either does not vaporize or vaporizes into a vapor phase that does not adversely impact the quality of the coated layers. The inert material is used to facilitate the handling of the evaporant. For example, some of the layers deposited are so small in thickness that only a minute quantity of the evaporant is needed. This minute quantity of evaporant can be mixed with some inert materials and pressed into a pellet so that it is easy to handle. Alternatively, this minute quantity of evaporant can be added to an inert carrier such as a porous ceramic or metallic pellet or ball so that it is easier to handle. Apparatus 5 can further include a mechanism to remove the un-vaporized inert material or carrier from evaporator 40 after the evaporant has been completely vaporized.

During the coating process, one or more of the quantized units are dispensed from container 45 by material dispenser 20 into evaporator 40 that has been heated to a temperature high enough to quickly and completely vaporize the quantized units of the evaporant. This is commonly known in the prior art as a flash evaporation process. The vapor transports through conduit 80 to area vapor dispenser 60 that in turn causes the vapor to flow over substrate 10 on platform 50 to deposit the desired layer onto substrate 10. It is possible that not all the vapor condenses on substrate 10. The loss of material is taken into account in determining the actual amount of evaporant contained in the quantized units.

To ensure that no material is condensed in apparatus 5, all surfaces that the vapor of the evaporant contacts during the coating process except the surface of substrate 10 are heated to an elevated temperature above the condensing temperature of the vapor. Platform 50 can also have heating or cooling arrangements to control the temperature of substrate 10 during deposition to achieve the desired properties in the deposited layer.

The deposition process can be carried out at atmospheric pressure. More preferably, however, the environment during the deposition process is kept at a reduced pressure over substrate 10 to reduce the condensation of vapor in the gas phase and to promote the deposition of smoother films. The preferred pressure is 1 mbar or less.

A deposition mask can be used during the deposition process to create a desired deposition pattern on substrate 10. Apparatus 5 preferably includes arrangements to place and align the deposition mask relative to substrate 10. Apparatus 5 can also change masks so that different patterns can be deposited on substrate 10 for different layers coated on substrate 10. Apparatus preferably also includes an arrangement to load uncoated substrate 10 onto platform 50 and remove substrate 10 after it is coated.

In practical applications, a quantized unit can contain just the right amount of the evaporant to deposit the entire desired thickness of a layer onto substrate 10. In this case, a single quantized unit is dispensed for depositing this layer. Alternatively, a quantized unit can contain just the right amount of the evaporant to deposit a fraction of the layer. In this case, more than one quantized unit of the evaporant is dispensed by material dispenser 20 into evaporator 40 for the deposition of the layer. The evaporant can contain one single material, or it can contain more than one material. Since the flash evaporation process is used and the evaporator is maintained at a temperature high enough to completely and quickly vaporize all the materials in the quantized unit, the materials in the evaporant can have different vapor pressure-temperature relationships. The deposited layer is expected to have the same composition as the evaporant.

Alternatively, for the deposition of a multi-component layer, more than one quantized units, each containing a prescribed amount of one or more components of the final layer composition can be dispensed into the evaporator 40 during the coating process. These quantized units can be stored in the same container 45 or can be stored in different containers. Quantized units can be dispensed using the same material dispenser 20 or using different dispensers. Again because of the quick and complete evaporation process the final deposited layer is expected to have a uniform composition including all the components in the quantized units. Apparatus 5 may include a control valve 95 located between evaporator 40 and area vapor dispenser 60. Control valve 95 can be used to ensure that the evaporant is completely vaporized before allowing the vapor to transport to area vapor dispenser 60. This is particularly useful when the evaporant contains more than one material with different evaporation temperatures. Control valve 95 can also be used to reduce back flowing of vapor from area vapor dispenser 60 into evaporator 40 when vapors from other evaporators are transported into area vapor dispenser 95 since there may be more than one evaporator 40 connected to area vapor dispenser 95.

Because all surfaces that the vapor contacts except the surface of substrate 10 are heated to above the condensation temperature of the evaporant during the deposition process, apparatus 5 can be used for coating multiple layers on to substrate 10 and these layers can be of different materials. A multi-layered device is deposited by repeating the deposition process described above in sequence. For each of the layers, one or more quantized units of different evaporant materials are dispensed into evaporator 40 and completely vaporized. The vapor is transported to area vapor dispenser 60 to be deposited onto substrate 10. The evaporants for the layers can be stored in the same container 45, or different containers. The quantized units of evaporants can be vaporized in the same evaporator 40 or different evaporators.

In another embodiment of the present invention, the function of the evaporator and the vapor dispenser is combined. The quantized units of evaporant are dispensed directly into area vapor dispenser 60, which is maintained at a high temperature such that flash evaporation of the evaporants can take place.

Area vapor dispenser 60 can have a linear array of apertures 90. In this case the dispenser can be used to produce a rectangular-shaped or oval-shaped coating on substrate 10. This can be used in combination with a fixed substrate and a shifting deposition mask or a fixed deposition mask and a shifting substrate to produce devices having stripes of different materials. For example, an OLED device having alternate stripes of blue, green, and red emitting regions can be produced by shifting a substrate under a fixed mask under area vapor dispenser 60 for the sequential deposition of the three types of colored emitter stripes on substrate 10. Most preferably, area vapor dispenser 60 contains a two dimensional array of apertures 90. This design is particularly suited for coating large area substrates. Apparatus 5 equipped with an area vapor dispenser 60 having a two-dimensional array of apertures 90 is particularly suitable for coating large area multilayer devices. The multiple layers in the devices can be deposited by sequentially dispensing quantized units of evaporants for the individual layers into evaporator 40 without having to move substrate 10. Because the amount of the dispensed evaporants is prescribed, there is no need for deposition rate or layer thickness monitor or control during the deposition process. The equipment and the process are both simplified and the production yield is increased. Even especially thin layers that are difficult to prepare using prior art methods can be prepared easily using the present invention.

In another embodiment, container 45 is a container for holding a charge of material suspended as an aerosol in an inert carrier gas. Material dispenser 20 meters a prescribed quantity of the aerosol of fluidized powdered material into evaporator 40.

In another embodiment, container 45 holds a solution of material dissolved in a supercritical solvent, such as supercritical $CO_2$. Evaporation or rapid expansion of the solution of material in the supercritical solvent is a way of providing material in a fluidized powdered form. This process has been described in detail by Long et al. in above-cited U.S. patent application Ser. No. 10/805,980. Material dispenser 20 meters a prescribed quantity of the thus-generated fluidized powdered material into evaporator 40.

The vapor of the evaporant from evaporator 40 transports to area vapor dispenser 60. A pressure develops as the vapor enters area vapor dispenser 60 and exits area vapor dispenser 60 through the series of apertures 90. Apertures 90 are in communication with area vapor dispenser 60 such that the vapor can be directed through apertures 90 onto substrate 10 placed on platform 50. The conductance within area vapor dispenser 60 is designed to be roughly two orders of magnitude larger than the total conductance of apertures 90 as described by Grace et al. in above-cited U.S. patent application Ser. No. 10/352,558. This conductance ratio promotes good pressure uniformity within area vapor dispenser 60 and thereby reduces flow non-uniformities through apertures 90 over the surface of substrate 10. Good deposition uniformity over substrate 10 is thus achieved.

Because only the quantized units of evaporant are heated to the vaporization temperature, while the bulk of the material is kept well below the vaporization temperature, the degradation of the evaporant due to high temperature is limited. The material utilization is also improved as no evaporant is evaporated except during the deposition of the desired layer. Furthermore, apparatus 5 can be used in any orientation. For example, vaporization apparatus 5 can be oriented 180° from what is shown in FIG. 1 so as to deposit onto a substrate placed above it. This is an advantage not found in the heating boats of the prior art.

Apparatus 5 can be used to deposit evaporants for which the condensation temperature does not exceed the maximum useable temperature of the materials for constructing the various parts of apparatus 5. It is particularly suitable for the deposition of organic layers such as those in constructing organic light-emitting devices (OLED) or organic solar cells, but it can also be used for depositing inorganic materials that do not require exceedingly high temperature to evaporate.

Figure 2:
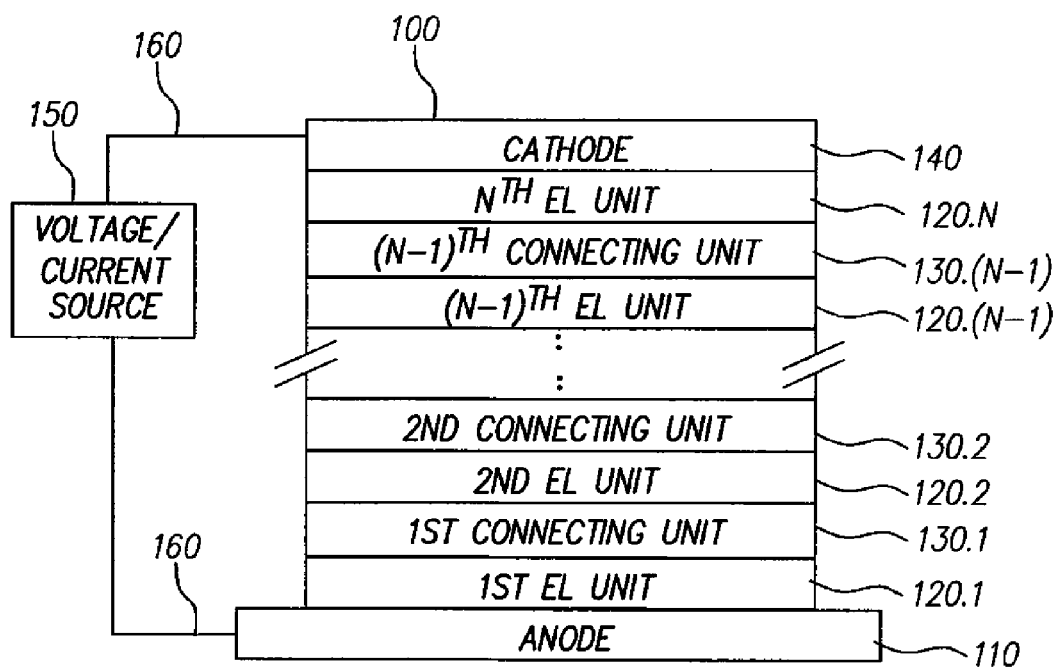

Turning now to FIG. 2, which shows a tandem OLED 100 that can be prepared with the present invention. This tandem OLED 100 has an anode 110 and a cathode 140, at least one of which is transparent. Disposed between the anode 110 and the cathode 140 are N organic EL units 120, where N is an integer greater than 1. These organic units can be deposited using the apparatus shown in FIG. 1. These organic EL units are serially connected to each other and to the anode 110 and the cathode 140, are designated 120.1 to 120.N where 120.1 is the first EL unit (adjacent to the anode) and 120.N is the $N^{th}$ unit (adjacent to the cathode). The term EL unit 120 represents any of the EL units named from 120.1 to 120.N in the present invention. When N is greater than 2, there are organic EL units not adjacent to the anode 110 or cathode 140, and these can be referred to as intermediate organic EL units. Disposed between any two adjacent organic EL units is a connecting unit 130. There are a total of N−1 connecting units associated with N organic EL units, designated as 130.1 to 130.(N−1). Connecting unit 130.1 is disposed between organic EL units 120.1 and 120.2, and connecting unit 130.(N−1) is disposed between organic EL units 120.(N−1) and 120.N. The term connecting unit 130 represents any of the connecting units named from 130.1 to 130.(N−1) in the present invention. The tandem OLED 100 is externally connected to a voltage/current source 150 through electrical conductors 160.

Tandem OLED 100 is operated by applying an electric potential generated by a voltage/current source 150 between a pair of contact electrodes, anode 110 and cathode 140, such that anode 110 is at a more positive potential with respect to the cathode 140. This externally applied electrical potential is distributed among the N organic EL units in proportion to the electrical resistance of each of these units. The electric potential across the tandem OLED causes holes (positively charged carriers) to be injected from anode 110 into the $1^{st}$ organic EL unit 120.1, and electrons (negatively charged carriers) to be injected from cathode 140 into the $N^{th}$ organic EL unit 120.N. Simultaneously, electrons and holes are generated in, and separated from, each of the connecting units (130.1-130.(N−1)). Electrons thus generated in, for example, connecting unit 130.(N−1) are injected towards the anode 110 and into the adjacent organic EL unit 120.(N−1). Likewise, holes generated in the connecting unit 130.(N−1) are injected towards the cathode 140 and into the adjacent organic EL unit 120.N. Subsequently, these electrons and holes recombine in their corresponding organic EL units to produce light, which is observed via the transparent electrode or electrodes of the OLED. In other words, the electrons injected from the cathode 140 are energetically cascading from the $N^{th}$ organic EL unit to the $1^{st}$ organic EL unit, and emit light in each of the organic EL units.

Each organic EL unit 120 in the tandem OLED 100 is capable of supporting hole and electron-transport, and electron-hole recombination to produce light. Each organic EL unit 120 can include a plurality of layers including HTL (hole transport layer), ETL (electron transport layer), LEL (light emitting layer), HIL (hole injection layer), and EIL (electron injection layer). A light-emitting layer (LEL) can include one or more sub-layers each emitting a different color. There are many organic EL multilayer structures known in the art that can be used as the organic EL unit of the present invention. These include HTL/ETL, HTL/LEL/ETL, HIL/HTL/LEL/ETL, HIL/HTL/LEL/ETL/EIL, HIL/HTL/electron-blocking layer or hole-blocking layer/LEL/ETL/EIL, HIL/HTL/LEL/hole-blocking layer/ETL/EIL. Each organic EL unit in the tandem OLED can have the same or different layer structures from other organic EL units. The layer structure of the $1^{st}$ organic EL unit adjacent to the anode preferably is of HIL/HTL/LEL/ETL, and the layer structure of the $N^{th}$ organic EL unit adjacent to the anode preferably is of HTL/LEL/ETL/

EIL, and the layer structure of the intermediate organic EL units preferably is of HTL/LEL/ETL.

The connecting unit provides electron injection into the electron-transporting layer and hole injection into the hole-transporting layer of the two adjacent organic EL units. Preferably, the connecting unit is transparent to the light emitted by the tandem OLED device. Also preferably, the connecting unit does not have too much in-plane electrical conductivity in order to prevent cross talk if the tandem OLED device is to be used in a pixilated display device or a segmented lighting device. The construction of such a connecting unit capable of providing good electron and hole injection has also been disclosed in commonly assigned U.S. Pat. No. 6,872,472, the disclosure of which is herein incorporated by reference. Most frequently, the connecting unit is constructed of two thin layers of materials one capable of electron injecting and the other capable of hole injecting. The two thin layers of materials are selected so that electrons and holes can transport between them without impediment. These materials can be organic or inorganic. Materials such as vanadium oxide, tungsten oxide, and organic materials doped with p-type dopant such as F4-TCNQ or $FeCl_3$ have been used as the hole-injecting part of the connecting unit; materials such as the alkaline or alkaline-earth metal doped organic has been used as the electron injecting part of the connecting unit (Chang et al Japanese Journal of Applied Physics 43, 9a, 6418 (2004); Liao et al. Applied Physics Letters 84, 167 (2004); Matsumoto et al. SID 03 Digest, pgs. 979-981 (2003)).

Tandem OLED devices can have a large number of layers. Most of the layers, with the exception of the cathode and the anode layers which are usually prepared by sputtering or high temperature evaporation, can be prepared using an apparatus and a method in accordance with the present disclosure. Substrate 10 can stay on platform 50 while quantized units of evaporants corresponding to the different layers in tandem OLED 100 are dispensed sequentially into the evaporator to form the layers. For layers that are not compatible with the method or the apparatus of the present invention, substrate 10 can be removed from platform 50 and moved into the appropriate apparatus for coating those layers. After those incompatible layers have been coated, substrate 10 can be move back to apparatus 5 or another apparatus in accordance with the present invention and continue coating other layers using the method in accordance with the present invention.

The invention has been described in detail with particular reference to certain preferred embodiments thereof, but it will be understood that variations and modifications can be effected within the spirit and scope of the invention.

PARTS LIST 5 vaporization apparatus
10 substrate
15 vacuum generator
20 material dispenser
35 heating elements
40 evaporator
45 container
50 platform
60 vapor dispenser
65 cooling elements
70 deposition chamber
80 conduit
85 shield
90 aperture
95 control valve
100 tandem OLED
110 anode
120 EL unit
120.1 $1^{st}$ EL unit
102.2 $2^{nd}$ EL unit
120.(N-1) $(N-1)^{th}$ EL unit
120.N $N^{th}$ EL unit
130 connecting unit
130.1 $1^{st}$ connecting unit
103.2 $2^{nd}$ connecting unit
130.(N-1) $(N-1)^{th}$ connecting unit
140 cathode
150 voltage/current source
160 electrical conductors

The invention claimed is:

1. A method of depositing a layer onto a substrate, comprising:
   heating an evaporator to a temperature capable of completely evaporating the evaporant to be deposited;
   dispensing into the evaporator one or more quantized units of the evaporant where the evaporant is completely vaporized;
   providing an area vapor dispenser having a plurality of apertures; and
   directing the evaporized evaporant from the evaporator to the area vapor dispenser so that the vaporant is dispensed through the apertures to deposit the layer on the substrate area; wherein one or more shields are added under the area vapor dispenser and above the substrate to cool the evaporant, and the one or more shields have a plurality of cooling elements formed inside thereof.

2. The method of claim 1, wherein at least one of the quantized units contains two or more evaporants.

3. The method according to claim 1, wherein more than one quantized unit is dispensed into the evaporator and wherein all the quantized units contain the same evaporant.

4. The method according to claim 1, wherein more than one quantized unit is dispensed into the evaporator and wherein at least one of the quantized units contains an evaporant different from those in the other quantized units.

5. The method according to claim 1, wherein the evaporant is dispensed along with inert material or an inert carrier.

6. The method according to claim 1, wherein the evaporant is in the form of a solid piece, or solid particles, or solid particles pressed into a pellet, or solid particles suspended in an inert liquid, or solid particles dispersed in a super critical $CO_2$, or a solution.

7. The method according to claim 1, further including maintaining the pressure in the environment over the substrate during deposition at a sub-atmospheric pressure.

8. The method according to claim 1, wherein the evaporant is in solution and dispensed into the evaporator by an inkjet-type printhead.

9. A method according to claim 1, wherein the area vapor dispenser functions as the evaporator.

10. A method of depositing multiple layers onto a substrate, comprising using the method of claim 1 for each layer.

11. The method of claim 10, wherein at least one of the quantized units contains two or more evaporants.

12. The method according to claim 11, wherein more than one quantized unit is dispensed into the evaporator and wherein all the quantized units contain the same evaporant.

13. The method according to claim 11, wherein more than one quantized unit is dispensed into the evaporator and wherein at least one of the quantized units contains an evaporant different from those of the other quantized units.

14. The method according to claim 11, wherein the evaporant is dispensed along with inert material or an inert carrier.

15. The method according to claim 11, wherein the evaporant is in the form of a solid piece, or solid particles, or solid particles pressed into a pellet, or solid particles suspended in an inert liquid, or solid particles dispersed in a super critical $CO_2$, or a solution.

16. The method according to claim 11, further including maintaining the pressure in the environment over the substrate during deposition at a sub-atmospheric pressure.

17. The method according to claim 11, wherein the evaporant is in solution and dispensed into the evaporator by an inkjet-type printhead.

* * * * *